United States Patent
Busson et al.

(10) Patent No.: US 8,238,469 B2
(45) Date of Patent: Aug. 7, 2012

(54) CALIBRATION IN A RADIO FREQUENCY TRANSMISSION MODULE

(75) Inventors: Pierre Busson, Grenoble (FR); Isabelle Telliez, Saint-Martin D'Heres (FR); Frederic Paillardet, Tresserve (FR)

(73) Assignee: ST-Ericsson SA, Plan-les-Ouates (CH)

( * ) Notice: Subject to any disclaimer, the term of this patent is extended or adjusted under 35 U.S.C. 154(b) by 972 days.

(21) Appl. No.: 12/061,088

(22) Filed: Apr. 2, 2008

(65) Prior Publication Data
US 2008/0253473 A1  Oct. 16, 2008

(30) Foreign Application Priority Data
Apr. 2, 2007 (FR) ...................................... 07 54198

(51) Int. Cl.
*H04L 27/00* (2006.01)
(52) U.S. Cl. ........ 375/295; 375/135; 375/136; 375/146; 375/147; 375/260; 375/262; 375/267; 375/316; 375/345
(58) Field of Classification Search .................. 375/295, 375/135, 136, 146, 147, 260, 262, 267, 316, 375/345
See application file for complete search history.

(56) References Cited

U.S. PATENT DOCUMENTS

| | | | | |
|---|---|---|---|---|
| 7,187,725 B2 * | 3/2007 | Song et al. | ..................... | 375/316 |
| 7,450,919 B1 * | 11/2008 | Chen et al. | ................. | 455/226.1 |
| 7,570,923 B2 * | 8/2009 | Kiss et al. | .................. | 455/67.14 |
| 7,627,295 B2 * | 12/2009 | Takahiko et al. | ............. | 455/139 |
| 2003/0072393 A1 * | 4/2003 | Gu | .................................. | 375/322 |
| 2006/0233284 A1 * | 10/2006 | Sullivan | ........................ | 375/329 |
| 2008/0171522 A1 * | 7/2008 | Ben-Ayun et al. | ............. | 455/126 |
| 2008/0232611 A1 * | 9/2008 | Filipovic et al. | ............. | 381/94.3 |

FOREIGN PATENT DOCUMENTS

| | | |
|---|---|---|
| EP | 1 039 628 A1 | 9/2000 |
| EP | 1 152 526 A1 | 11/2001 |
| FR | 2 859 055 A1 | 2/2005 |
| GB | 2 272 589 A | 5/1994 |
| WO | 00/31941 A1 | 6/2000 |
| WO | 02/51003 A2 | 6/2002 |
| WO | 03/023948 A2 | 3/2003 |

OTHER PUBLICATIONS

Pun, K., et al., "A Digital Method for the Correction of I/Q Phase Errors in Complex Sub-Sampling Mixers," IEEE SSMSD, Feb. 2000, pp. 171-174.
Pun, K., et al., "Wideband Digital Correction of I and Q Mismatch in Quadrature Radio Receivers," IEEE Symposium on Circuits and Systems, May 2000, pp. V-661-V-664.

* cited by examiner

*Primary Examiner* — Dhaval Patel
(74) *Attorney, Agent, or Firm* — Potomac Patent Group, PLLC

(57) ABSTRACT

A radio frequency transmission module is adapted to generate a first signal to be transmitted and to convert the signal to a radio frequency carrier for its radio transmission, in an operational phase, and is adapted to generate a second signal and to convert the second signal to the radio frequency carrier, in a calibration phase. The module includes a calibration unit having a subsampler adapted to subsample the second converted signal and a calculation unit adapted to calculate Fourier Transform coefficients representative of the signal delivered by the subsampler, for the purposes of processing the first signal to be transmitted, in the operational phase, as a function of at least some of the Fourier coefficients calculated in the calibration phase.

21 Claims, 2 Drawing Sheets

CALIBRATION IN A RADIO FREQUENCY TRANSMISSION MODULE

TECHNICAL FIELD

The present disclosure generally relates to integrated electronic circuits, particularly but not exclusively those comprised within radio frequency transmission modules.

Such radio frequency transmission modules are encountered in "communications" equipment such as wireless telephones and wireless personal digital assistants.

BACKGROUND INFORMATION

Certain radio frequency transmission modules are adapted to obtain a signal at a first frequency $F_1$ carrying the desired information, and to convert this signal to a radio frequency carrier of frequency $F_{LO}$ for its radio transmission by antenna. The desired information is then in fact carried by a second radio frequency $F_1+F_{LO}$. The frequency $F_1$ can be the zero frequency (baseband) or a frequency called an "intermediate frequency."

It is known that the conversion to the second frequency generates a desired signal at the second frequency $F_1+F_{LO}$, a signal corresponding to the carrier at frequency $F_{LO}$ and an image signal at the frequency $F_1-F_{LO}$.

There are generally set constraints regarding such a radio frequency transmission module. These constraints include, for example, a maximum limit for the ratio of the image signal level to the desired signal level, called the image rejection ratio (IRR).

Let us consider a radio frequency transmission module 110 such as the one represented in FIG. 1. It comprises, for example, a digital signal processor (DSP) 100 adapted to deliver a digital signal of frequency $F_1$ on an I channel (in-phase channel), and a digital signal of frequency $F_1$ on a Q channel (quadrature channel).

Each of these signals is input to a respective digital-to-analog converter (DAC) 101, 102 and the analog signals output by the digital-to-analog converters are input to a conversion stage 103 for conversion to a radio frequency $F_1+F_{LO}$.

The frequency conversion stage 103 comprises two mixers 112, 114, using a Gilbert structure for example.

The mixer 112 placed on the I channel is adapted to mix the signal on the I channel provided as input to the conversion stage 103, for conversion to a signal with a carrier signal LO at radio frequency $F_{LO}$.

The mixer 114 placed on the Q channel is adapted to mix the signal on the Q channel provided as input to the conversion stage 103, for conversion to a signal with a carrier signal LO' at radio frequency $F_{LO}$, and out of phase by 90° relative to the carrier signal LO.

In an operational phase, the signals resulting from this mixing and issuing from the I and Q channels are summed, then delivered by the conversion stage 103 before any further processing is applied to them, then sent to a power amplifier 104. It is then transmitted by a transmitting antenna.

In a calibration phase, test digital signals, in the shape of a sine or cosine wave for example, are delivered by the digital signal processor 100 on the I and Q channels. The signal provided by the power amplifier 104 is then input to a calibration loop 105.

The calibration loop 105 comprises a power detector 106, an analog-to-digital converter (ADC) 107, and a digital signal processor 108.

The power detector 106 is adapted to determine the envelope of the signal provided as input, to detect the power level of said signal, and to determine the IRR corresponding to said signal. The digital signal processor 108 is adapted, if the calculated IRR exceeds the maximum limit set for the IRR, to determine the calibration coefficients as a function of the signal which is provided as input. These determined calibration coefficients are provided as input parameters to the digital signal processor 100.

In the operational phase, the digital signal processor 100 is adapted to process the digital signals (which are no longer test signals) before they are provided to the I and Q channels. This processing can adapt the amplitude and/or phase of the signal intended for the I channel and/or the signal intended for the Q channel as a function of the calibration coefficients determined during the calibration phase and provided as input to the digital signal processor 100.

Thus, the calibration described here enables the IRR value for the desired signals transmitted during the operational phase to be less than the maximum limit tolerated. Note that other calibrations can be performed, with advantages other than image frequency rejection, for example to compensate for non-linearities of the power amplifier.

Such a calibration technique, based on detecting the power level of a signal output by the frequency conversion stage, yields satisfactory results in a certain number of applications. However, it is no longer satisfactory when the maximum limit to be taken into account for the IRR is less than or equal to −40 dB, because it no longer allows sufficient precision.

BRIEF SUMMARY

One embodiment enables the calibration of signals in a radio frequency transmission module, taking into account a maximum authorized IRR limit which is less than or equal to −40 dB.

For this purposes, a first aspect provides a radio frequency transmission module adapted to generate a first signal for transmission and to convert said signal to a radio frequency carrier for its radio transmission, in an operational phase, and adapted to generate a second signal and convert said second signal to the radio frequency carrier, in a calibration phase.

This radio frequency transmission module comprises a calibration unit adapted to calculate, in the calibration phase, Fourier Transform coefficients from the second converted signal, and comprising a subsampler and a calculation unit, with the subsampler adapted to subsample the second converted signal, and with the calculation unit adapted to calculate the Fourier Transform coefficients representative of the signal delivered by the subsampler, for the purposes of processing the first signal to be transmitted, in the operational phase, as a function of at least some of said Fourier coefficients calculated in the calibration phase.

Such a radio frequency transmission module is thus adapted to implement a signal calibration to meet strict IRR constraints. In particular, such a radio frequency transmission module allows calculating with precision, from at least some of the calculated Fourier Transform coefficients, the IRR corresponding to the second signal transposed on the radio frequency, to compare it with a maximum limit less than or equal to −40 dB, and to deduce the phase or amplitude adjustments to make to a signal to be transmitted in an operational phase, so that the signal actually transmitted meets the IRR constraint.

One role of the subsampling is to provide a spectrum comprising components corresponding to the components of the second transposed signal, of the signal image at frequencies below that of the radio frequency carrier, from which the analog-to-digital conversion and the Fourier Transform calculations are performed.

In one embodiment, the calibration unit additionally comprises a filter placed between the subsampler and the calculation unit, and adapted to extract a portion of the frequency spectrum of the second signal subsampled by the subsampler, said portion comprising a component corresponding to the second converted signal and a component corresponding to an image of the second converted signal, with the calculation unit adapted to calculate Fourier Transform coefficients representative of the signal delivered by the filter. This arrangement thus allows extracting only a portion of the signal of interest, comprising all the information used for the calibration. This simplifies the calculations to be performed.

In one embodiment, the filter is a low-pass filter adapted to extract the portion of the spectrum of the second subsampled signal comprising the component corresponding to the second converted signal and the component corresponding to an image of the second converted signal, these being the closest to the zero frequency. This arrangement allows performing the calculation operations at the zero frequency, which simplifies these operations.

In one embodiment, the second signal is a sine or cosine test signal. This arrangement allows a simple and direct determination of the Fourier Transform coefficients.

In one embodiment, the radio frequency transmission module is adapted to modify the phase and/or amplitude of the first signal to be transmitted in the operational phase, as a function of at least some of the Fourier coefficients calculated in the calibration phase using the second signal.

In a second aspect, a radio frequency transmission/reception system comprises a radio frequency transmission module according to the first aspect and a radio frequency reception module, said transmission and reception modules being adapted to operate in phase and in quadrature and to share the use of the calculation unit, with the radio frequency transmission module being adapted to process said first signal to be transmitted in the operational phase as a function of the Fourier coefficients calculated, in the calibration phase by the calculation unit, for one from either an in-phase component or a quadrature component of the second signal provided, excluding the Fourier coefficients calculated, in the calibration phase, for the other from either said in-phase component or said quadrature component of the second signal. Such a system allows reusing the means comprised in the receiving module, for the calculation performed by the calibration loop, while avoiding the inclusion in the calibration of mismatches between the in-phase channel and the quadrature channel of the module.

In a third aspect, a processing method in a radio frequency transmission module is adapted, in an operational phase of the module, to generate a first signal to be transmitted and to convert said first signal to a radio frequency carrier for its radio transmission, with said process comprising the following in a calibration phase of said module:
generate a second signal and convert said second signal to the radio frequency carrier,
subsample said second signal converted to radio frequency, calculate Fourier Transform coefficients representative of the subsampled signal in order to process the first signal to be transmitted in the operational phase as a function of at least some of the Fourier coefficients calculated in the calibration phase.

BRIEF DESCRIPTION OF THE SEVERAL VIEWS OF THE DRAWINGS

Other features of one or more embodiments will become evident upon reading the non-limiting and non-exhaustive description which follows. This is purely illustrative and is to be read while referring to the attached drawings, in which.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
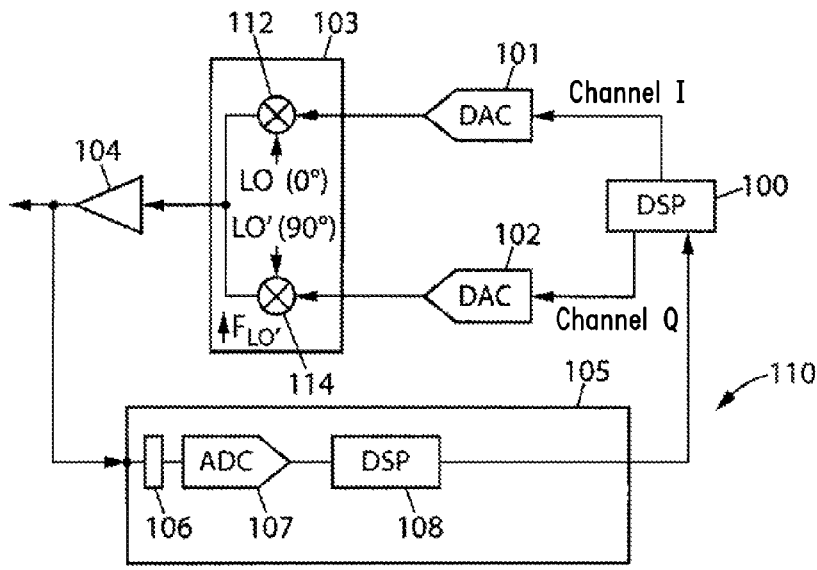
FIG. 1 shows a radio frequency transmission module as previously described.
Figure 2:
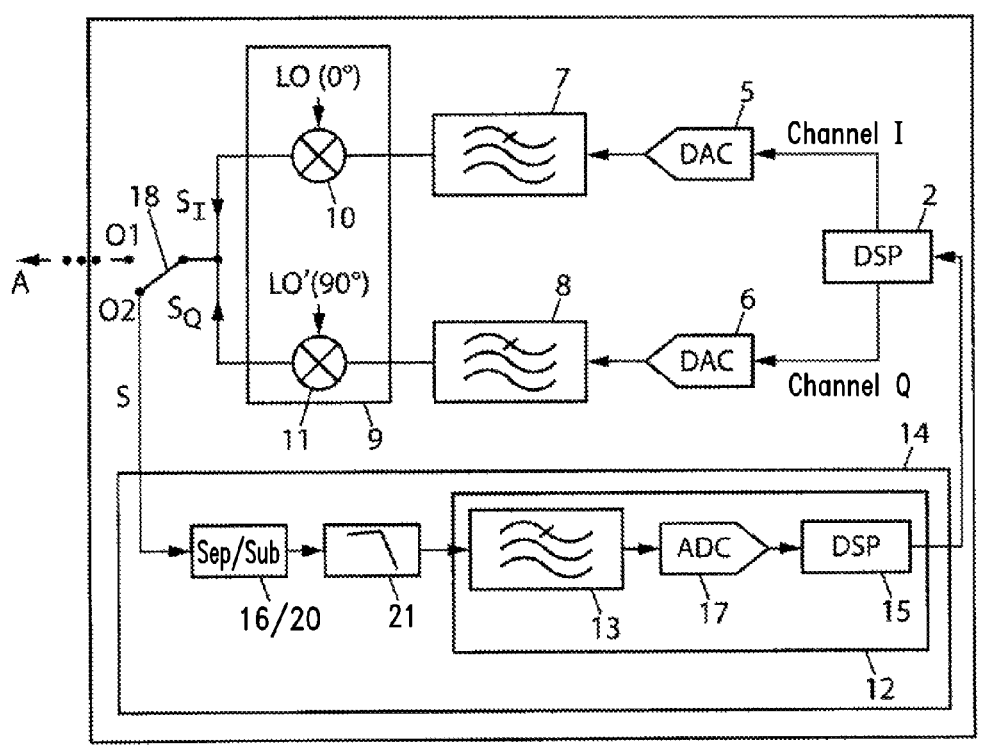
FIG. 2 represents a transmission module 1 in one embodiment, and the top part of FIG. 3 schematically represents the spectrum of the signal output from the filter 13 represented in FIG. 2, and the bottom part represents the frequencies at which the FFT coefficients are calculated in one embodiment.

FIG. 2 shows a radio frequency transmission module 1 in one embodiment.

The radio frequency transmission module 1 is adapted to operate in either a calibration phase or an operational phase.

The radio frequency transmission module 1 comprises a digital signal processor 2, two digital-to-analog converters 5, 6 adapted to convert an input digital signal into an analog signal, a frequency conversion stage 9, a switch 18, and a calibration loop 14.

The digital signal processor 2 is adapted to deliver two digital signals $s_I$ and $s_Q$.

The signal $s_I$ is intended for the in-phase channel, called the I channel, of the radio frequency transmission module 1, while the signal $s_Q$ is intended for the quadrature channel, called the Q channel, of the radio frequency transmission module 1.

For example, signals $s_I$ and $s_Q$ are identical signals except that they are out of phase with each other by 90°.

On the I channel, the digital signal $s_I$ is delivered to the digital-to-analog converter 5. On the Q channel, the digital signal $s_Q$ is delivered to the digital-to-analog converter 6. The analog signals respectively issuing from the digital-to-analog converters 5 and 6 are then delivered to band-pass filters 7 and 8. The resulting filtered signals are then provided to the frequency conversion stage 9.

The frequency conversion stage 9 comprises two mixers 10, 11, in a Gilbert structure for example. The mixer 10 placed on the I channel is adapted to mix the signal provided on the I channel as input to the conversion stage 9 for impression onto a carrier signal LO at radio frequency $F_{LO}$. The mixer 11 placed on the Q channel is adapted to mix the signal provided on the Q channel as input to the conversion stage 9 for conversion to a signal with a carrier signal LO' at radio frequency $F_{LO}$, 90° out of phase with the carrier signal LO. The signal $S_I$ resulting from this frequency conversion is then delivered on the I channel by the frequency conversion stage 9, while the signal $S_Q$ resulting from this frequency conversion is delivered on the Q channel by the frequency conversion stage 9.

The spectrum for the signal $S_I$, similarly to the one for the signal $S_Q$, comprises a non-zero carrier component at the radio frequency $F_{LO}$, a non-zero desired signal component at the radio frequency $F_{LO}+F_1$, and an image signal component at the radio frequency $F_{LO}-F_1$ (in other embodiments, the non-zero desired signal component corresponds to the radio frequency $F_{LO}-F_1$, and the image signal component to the radio frequency $F_{LO}+F_1$).

The signals $S_I$ and $S_Q$ resulting from the mixing performed by the frequency conversion stage 9 and issuing from the I and Q channels are summed into a summed signal S, which is input to a switch 18. The switch 18 is adapted to couple the output from the frequency conversion stage 9 to a terminal O1, in an operational phase, and to couple the output from the frequency conversion stage 9 to a terminal O2, in a calibration phase.

In a calibration phase, the signals $s_I$ and $s_Q$ are, for example, digital sine or digital cosine signals of frequency $F_1$ (where $F_1$ is not a radio frequency).

In an operational phase, these signals $s_I$ and $s_Q$ are digital signals carrying the information for transmission. They comprise a non-zero component at frequency $F_1$.

In an operational phase, the summed signal provided to the terminal O1 by the switch 18 possibly undergoes additional processing within the radio frequency transmission device 1, for example amplification, before being transmitted by a transmitting antenna A.

In a calibration phase, the summed signal provided to the terminal O2 by the switch 18 is delivered as input to the calibration loop 14.

The operations performed in the calibration phase by the calibration loop 14 allow, in one embodiment, determining from test signals the processing to be applied by the digital signal processor 2 to signals on the I and Q channels in an operational phase. Some of this processing is, for example, for the purposes of constraining the IRR of the radio frequency signals provided based on these signals to be below a set maximum IRR.

The calibration loop 14 of one embodiment comprises a separating unit 16, a subsampler 20, a low-pass filter 21 and a digital processing unit 12.

The digital processing unit 12 of one embodiment comprises a band-pass filter 13, an analog-to-digital converter 17, followed by a digital signal processor 15.

In the calibration phase, the summed signal S equal to the $S_I+S_Q$ issuing from the test signals is provided as input to the subsampler 20.

The subsampler 20 is adapted to subsample the signal S, at a given frequency $f_e$ (to avoid spectrum aliasing problems, $f_e$ is chosen to be greater than $2F_1$).

This subsampling has the effect of reproducing the spectrum of signal S every $f_e$ frequency.

Thus components similar to the one situated at frequency $F_{LO}$ are reproduced at frequencies $F_{LO}+if_e$, where i is any whole number. Similarly, components similar to the ones respectively located at frequency $F_{LO}+F_1$ and $F_{LO}-F_1$, are reproduced at the respective frequencies $F_{LO}+F_1+if_e$ and $F_{LO}-F_1+if_e$, where i is any whole number.

This subsampled signal is then provided to the low-pass filter 21, which is adapted to extract, from the other spectrum reproductions, the reproduction of the spectrum for the signal S comprising the components at frequencies $F_{LO}-k_0f_e$, $F_{LO}+F_1-k_0f_e$, and $F_{LO}-F_1-k_0f_e$, which are the closest to 0 (meaning $k_0$ is such that no matter what the integer value of k, the absolute value of $F_{LO}-k_0f_e$ is less than or equal to the absolute value of $F_{LO}-kf_e$).

Then the obtained filtered signal is provided to the digital processing unit 12. The signal will then be filtered using a band-pass filter 13, which will isolate the part of the spectrum corresponding to the three frequency components of interest $F_{LO}-k_0f_e$, $F_{LO}+F_1-k_0f_e$, and $F_{LO}-F_1-k_0f_e$, representing the carrier components, of the desired signal and the image signal.

Then the signal output from the band-pass filter 13 is provided to the analog-to-digital converter 17, which converts the analog signal received as input into a digital signal, then delivers the obtained digital signal to the digital signal processor 15.

This processor 15 calculates the Fourier coefficients from the signal which is input to it, using a Fast Fourier Transform or FFT for example.

The Fourier coefficients calculated for the frequencies closest to frequencies $F_{LO}-k_0f_e$, $F_{LO}+F_1-k_0f_e$, and $F_{LO}-F_1-k_0f_e$ are then processed by the digital signal processor 15.

The digital signal processor 15 is especially adapted to deduce, as a function of at least the amplitude of the Fourier coefficient calculated for the frequency closest to $F_{LO}+F_1-k_0f_e$ (corresponding to the desired signal) and the amplitude of the Fourier coefficient calculated for the frequency closest to $F_{LO}-F_1-k_0f_e$ (corresponding to the image signal), the IRR for the signal S, and then to compare the calculated IRR with the set maximum IRR.

The digital signal processor 15 is adapted to determine one or more calibration coefficients as a function of this comparison.

These calibration coefficients are communicated to the digital signal processor 2. The processor is adapted to process, in the next operational phase, the digital signals $s_I$ and/or $s_Q$ before they are provided to the digital-to-analog converters 101, 102, as a function of at least one calibration coefficient determined by the calibration loop 14.

The processing applied to the digital signals $s_I$ and/or $s_Q$ as a function of at least some of the calibration coefficients can be modifications to the phase and/or amplitude of said signals.

In one embodiment, a calibration coefficient is additionally determined by the digital signal processor 15 as a function of at least the amplitude of the Fourier coefficient calculated for the frequency closest to $F_{LO}-k_0f_e$, corresponding to the component of the carrier $F_{LO}$.

Figure 3:
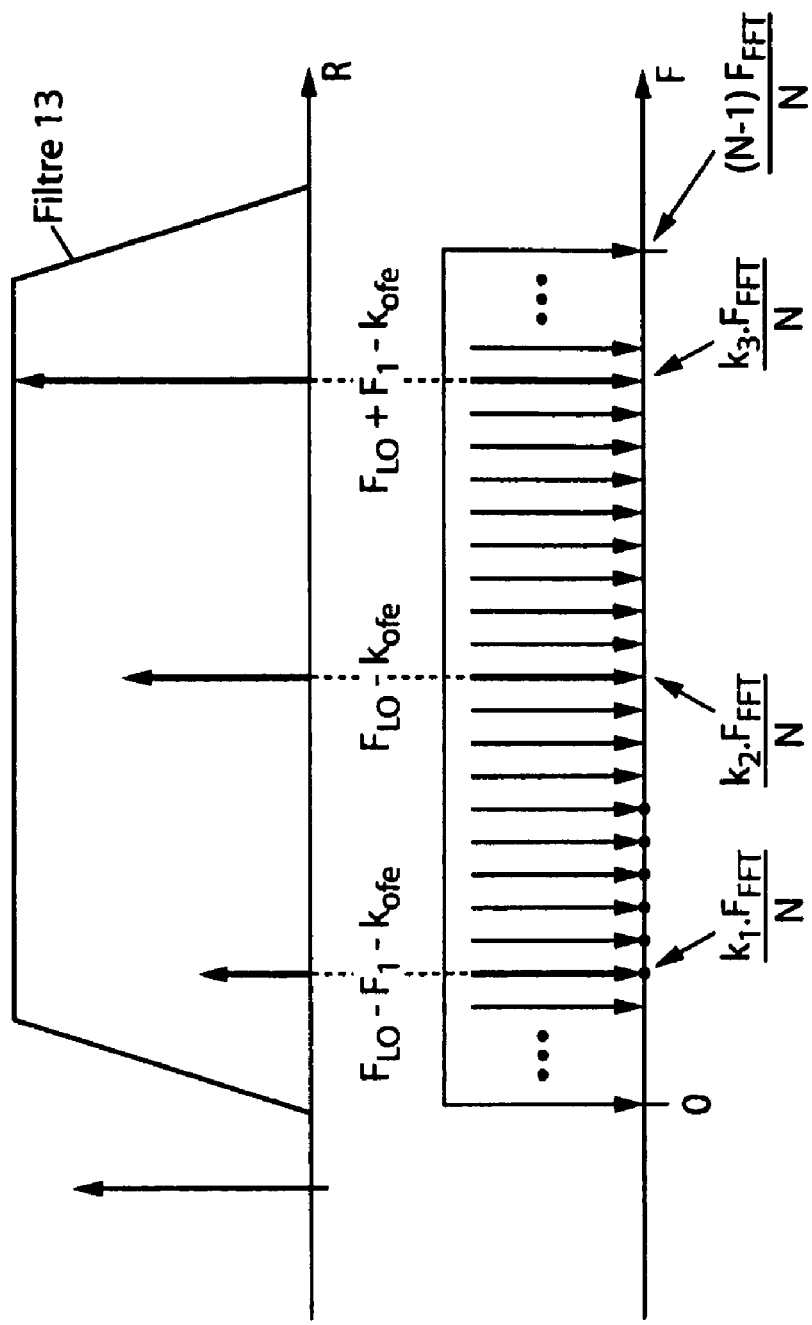

In one embodiment, $F_{LO}$ and $f_e$ are chosen such that the frequency $F_{LO}-k_0f_e$ is non-zero and is a multiple of a reference frequency $F_{REF}$ (in other words, the frequency $F_{LO}$ is equal to the sum of a multiple of the sampling frequency and a multiple of the reference frequency) and the frequency F1 is chosen such that it is also a multiple of the reference frequency $F_{REF}$. The FFT is then defined, using its size N and its sampling frequency $F_{FFT}$, such that the Fourier coefficients are calculated in each of the frequencies $F_{LO}-k_0f_e$, $F_{LO}+F_1-k_0f_e$, and $F_{LO}-F_1-k_0f_e$ (the frequency $F_{FFT}$ is then a multiple of the reference frequency), as represented in FIG. 3. The frequency $F_{FFT}$ can be chosen to be equal to the reference frequency, for example.

The top part of FIG. 3 represents the part of the signal filtered by the band-pass filter 13.

The lower part of FIG. 3 represents the N frequencies $$\frac{i \times F_{FFT}}{N}, i$$

being a positive integer from 0 to N−1 for which the FFT provides a Fourier coefficient $$f\left(\frac{i \times F_{FFT}}{N}\right),$$

where N is the size of the FFT and $F_{FFT}$ its sampling frequency.

In the case in question, there exist integers $k_1$, $k_2$ and $k_3$ between 0 and N−1, such that $$\frac{k_1 \times F_{FFT}}{N} = F_{LO} - F_1 - k_0 f_e;$$

$$\frac{k_2 \times F_{FFT}}{N} = F_{LO} - k_0 f_e$$

and $$\frac{k_3 \times F_{FFT}}{N} = F_{LO} + F_1 - k_0 f_e.$$

In one embodiment, $F_1$ is equal to 1.25 MHz, and $F_{LO}$ is within the frequency band [2400 MHz-2484 MHz] (as specified in the 802.22 b/g standards) or within the frequency band [4900 MHz-5850 MHz] (as specified in the 802.11a standard). The frequency $f_e$ is chosen from within the range [15 MHz-50 MHz].

$f_e$ is chosen such that, for example, $F_{LO}-k_0 f_e$ is equal to 5 MHz. Then $F_{LO}-F_1-k_0 f_e$ is equal to 3.75 MHz and $F_{LO}+F_1-k_0 f_e$ is equal to 6.25 MHz. The frequencies $F_{LO}-k_0 f_e$ and $F_1$ are multiples of 312.5 kHz. The frequency $F_{FFT}$ is equal to the reference frequency 312.5 kHz.

In one embodiment, the digital processing unit 12 is part of a radio frequency reception module comprised for example in the terminal (a telephone for example) comprising the radio frequency transmission module 1. The resources are therefore shared between the transmitting part and the receiving part of the terminal.

In such an embodiment, in the calibration phase, the summed signal S used for the calibration is provided to only one of the I or Q channels of the digital processing unit 12 of the radio frequency reception module 1, for determining the calibration coefficients as a function of the processing performed on only one of the two channels of the processing unit 12. Alternatively, the total signal S is provided to both the I and Q channels of the digital processing unit 12 of the radio frequency reception module 1, meaning upstream from the mixers of the radio frequency reception module 1, for determining the calibration coefficients as a function of the processing performed on the two channels by the processing unit 12. However, this latter arrangement has one disadvantage, in that the calibration then takes into account the characteristics introduced by the processing performed on the I and Q channels of the radio frequency reception module 1 and not those introduced by the processing performed on the Q channel (or respectively the I channel) of the radio frequency reception module 1 (these characteristics not reproduced between the I and Q channels are called a mismatch).

In one embodiment, the low-pass filter 21 is replaced with a filter adapted to extract, from the subsampled spectrum, a reproduction of the spectrum of the signal S comprising the components at frequencies $F_{LO}-k_p f_e$, $F_{LO}+F_1-k_p f_e$, and $F_{LO}-F_1-k_p f_e$ ($k_p$ is a non-zero integer) which are not the closest to 0. For example, $k_p$ can be equal to $k_0+2$. Other values for $k_p$ are possible. In such a case, the digital processing unit 12 is adapted to, once the signal is received as a digital input, convert this digital signal to the zero frequency before applying the Fourier transformation.

One embodiment has been described above in a transmission module comprising an in-phase channel and a quadrature channel. In another embodiment, a radio frequency transmission module only comprises one signal processing channel.

A calibration of an embodiment allows, for example, calculating during a calibration phase the value of the IRR for a radio frequency signal delivered by the radio frequency emission module 1, comparing it with a limit value less than −40 dB, and processing the digital input signals at least once during an operational phase, as a function of at least the value of the IRR.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A radio frequency transmission module, comprising:
  a signal generator configured to: in an operational phase to generate a first signal to be transmitted and to convert the first signal to a carrier frequency for radio transmission, and in a calibration phase to generate a second signal and to convert the second signal to the carrier frequency; and
  a calibration unit configured to calculate Fourier Transform coefficients from the converted second signal in the calibration phase, the calibration unit including: a subsampler configured to produce a subsampled signal by subsampling the converted second signal, and a calculation unit configured to calculate Fourier Transform coefficients representative of the subsampled signal, wherein the second signal is a calibration signal and the signal generator is configured to process the first signal in the operational phase as a function of at least some of the Fourier Transform coefficients.

2. The radio frequency transmission module according to claim 1 wherein the calibration unit additionally includes a filter placed between the subsampler and the calculation unit and adapted to extract a portion of a frequency spectrum of the second signal subsampled by the subsampler, with said portion having a component corresponding to the second converted signal and a component corresponding to an image of the second converted signal, and said calculation unit being adapted to calculate Fourier Transform coefficients representative of a signal delivered by the filter.

3. The radio frequency transmission module according to claim 2 wherein the filter is a low-pass filter adapted to extract the portion of the spectrum of the second subsampled signal having the component corresponding to the second converted signal and the component corresponding to an image of the second converted signal which are closest to a zero frequency.

4. The radio frequency transmission module according to claim 1 wherein the second signal is a sine or cosine signal.

5. The radio frequency transmission module according to claim 1, further comprising a processor adapted to modify a phase and/or amplitude of the first signal to be transmitted in the operational phase as a function of at least some of the Fourier coefficients calculated in the calibration phase using the second signal.

6. A radio frequency transmission/reception system, comprising:
a radio frequency transmission module adapted to generate a first signal to be transmitted in an operational phase and to generate a second signal in a calibration phase, the radio frequency transmission module including:
a calibration unit adapted to calculate Fourier Transform coefficients from the second signal, in the calibration phase, and having
a subsampler adapted to subsample the second signal to provide a third signal and
a calculation unit coupled to the subsampler and adapted to calculate Fourier Transform coefficients representative of the third signal provided by the subsampler; and
a radio frequency reception module, the transmission and reception modules being adapted for in-phase and quadrature operation and adapted to share use of the calculation unit, with the radio frequency transmission module being adapted to process the first signal to be transmitted in the operational phase as a function of at least some of the Fourier Transform coefficients calculated in the calibration phase by the calculation unit, for one from either an in-phase component or a quadrature component of the second signal provided, excluding the Fourier Transform coefficients calculated, in the calibration phase, for the other from either the in-phase component or the quadrature component of the second signal wherein the second signal is a calibration signal.

7. The system of claim 6 wherein said radio frequency transmission and reception modules are part of a wireless telephone.

8. The system of claim 6 wherein said radio frequency transmission and reception modules are part of a wireless personal digital assistant.

9. The system of claim 6 wherein said radio frequency transmission module further includes:
a processor coupled to said calculation unit and adapted to receive said at least some of said calculated Fourier Transform coefficients to process said first signal to be transmitted; and
a first and second channels coupled to said processor to respectively provide in-phase and quadrature components of said first signal to be transmitted, the system further comprising:
a switch coupled to said first and second channels and coupled to said radio frequency reception module, said switch being adapted to perform a first switching to provide said first signal to be transmitted and adapted to perform a second switching to provide said first signal as input as said second signal into said calibration unit.

10. A processing method comprising:
generating, during an operational phase of a radio frequency transmission module, a first signal to be transmitted and converting the first signal to a carrier frequency for transmission;
generating, during a calibration phase of the radio frequency transmission module, a second signal and converting the second signal to the carrier frequency;
producing a subsampled signal by subsampling the converted second signal; and
calculating Fourier Transform coefficients representative of the subsampled signal, wherein generating the first signal includes generating the first signal as a function of at least some of the Fourier Transform coefficients and the second signal is a calibration signal.

11. The process according to claim 10, further comprising filtering the second subsampled signal to extract a portion of a spectrum of the second subsampled signal having a component corresponding to the second signal and a component corresponding to an image of the second signal.

12. The process according to claim 11 wherein the filtering includes low-pass filtering, in order to extract the portion of the spectrum of the second subsampled signal comprising the component corresponding to the second signal and the component corresponding to the image of the second signal which are closest to a null frequency.

13. The process according to claim 10 wherein the second signal is a sine or cosine signal.

14. A radio frequency apparatus, comprising:
transmission means for generating a first signal to be transmitted in an operational phase and for generating a second signal in a calibration phase;
subsampler means for subsampling, in the calibration phase, the second signal to provide a third signal; and
calculation means for calculating Fourier Transform coefficients representative of the third signal provided by the subsampler means to enable processing by the transmission means of the first signal to be transmitted, in the operational phase, as a function of at least some of the Fourier Transform coefficients calculated in the calibration phase wherein the second signal is a calibration signal.

15. The apparatus of claim 14 wherein said processing by said transmission means of the first signal as the function of at least some of said Fourier transform coefficients includes said transmission means adjusting a phase or amplitude of said first signal to meet an image rejection ratio (IRR) constraint.

16. The apparatus of claim 14 wherein said transmission means includes:
processor means for receiving said at least some of said calculated Fourier Transform coefficients to process said first signal to be transmitted; and
first and second channel means for respectively providing in-phase and quadrature components of said first signal to be transmitted, the apparatus further comprising:
switch means for performing a first switching to provide said first signal to be transmitted and for performing a second switching to provide said first signal as input as said second signal into said subsampler means.

17. The apparatus of claim 14, further comprising:
filter means for filtering said third signal provided by said subsampler means to provide a fourth signal; and
converter means for converting said fourth signal from analog form to digital form.

18. The apparatus of claim 17 wherein said filter means extracts a portion of a spectrum of the third signal, said portion having a component corresponding to the second signal and a component corresponding to an image of the second signal which are closest to a zero frequency.

19. The apparatus of claim 14 wherein said transmission means includes:
processor means for receiving the at least some of the calculated Fourier Transform coefficients to process the first signal to be transmitted; and
channel means for providing the first signal, as processed by the processor means, to be transmitted, the apparatus further comprising:
switch means for performing a first switching to provide the first signal to be transmitted and for performing a second switching to provide the first signal as input as the second signal into the subsampler means.

20. The apparatus of claim 14 wherein said transmission, subsampler, and calculation means form part of a handheld wireless communication device.

21. The radio frequency transmission module according to claim 1 wherein the subsampler is configured to subsample the converted second signal at a given frequency that is at least two times greater than a frequency of the first signal.

\* \* \* \* \*